United States Patent [19]

Hetyei

[11] Patent Number: 4,751,402
[45] Date of Patent: Jun. 14, 1988

[54] DEVICE FOR GENERATING A SIGNAL HAVING A COMPLEX FORM BY LINEAR APPROXIMATIONS

[75] Inventor: Joseph Hetyei, Bouffemont, France

[73] Assignee: Thomson-CSF, Paris, France

[21] Appl. No.: 847,088

[22] Filed: Apr. 1, 1986

[30] Foreign Application Priority Data

Apr. 2, 1985 [FR] France ................... 85 05012

[51] Int. Cl.[4] .................. H03K 13/02; H03K 4/00
[52] U.S. Cl. ..................... 307/260; 307/490;
307/246; 328/14
[58] Field of Search ............... 328/183, 184, 185, 14;
307/490, 228, 260, 263, 246, 247 A

[56] References Cited

U.S. PATENT DOCUMENTS

| | | | |
|---|---|---|---|
| 2,998,532 | 8/1961 | Smeltzer | 328/184 |
| 3,433,937 | 3/1969 | McCarthy | 307/490 |
| 3,621,281 | 11/1971 | Hagen | 328/183 |
| 3,808,463 | 4/1974 | Mulder | 307/490 |
| 4,197,509 | 4/1980 | Curran et al. | 328/67 |
| 4,446,436 | 5/1984 | Ireland | 328/14 |
| 4,524,362 | 6/1985 | Larson | 328/14 |

FOREIGN PATENT DOCUMENTS

| | | |
|---|---|---|
| 31139 | 7/1981 | European Pat. Off. . |
| 40541 | 11/1981 | European Pat. Off. . |
| 2441581 | 3/1976 | Fed. Rep. of Germany . |
| 1509840 | 1/1968 | France . |

Primary Examiner—Stanley D. Miller
Assistant Examiner—Richard Roseen
Attorney, Agent, or Firm—Pollock, VandeSande & Priddy

[57] ABSTRACT

The present invention concerns a device for generating a signal having a complex form through approximation, by utilizing straight-lined segments having variable slopes. It mainly comprises a generator for generating a constant current supplying in parallel a capacitor and a circuit which varies the current $i_1$ flowing through the capacitor. The variation of $i_1$ influences the current flowing through the capacitor. The output signal sampled at the terminals of the capacitor is thus a sequence of linear segments, the slope of which is discretely variable, and controlled by the circuit for varying the current $i_1$.

5 Claims, 3 Drawing Sheets

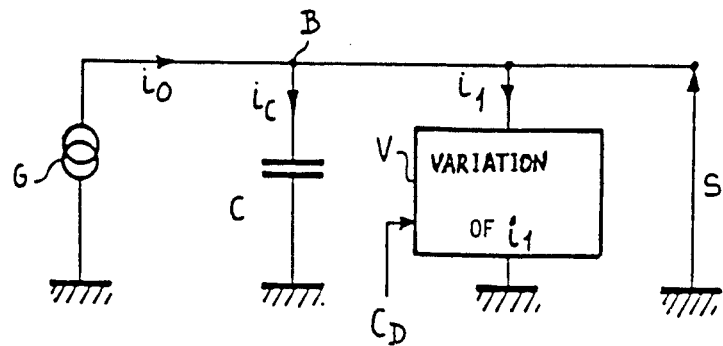
FIG_1
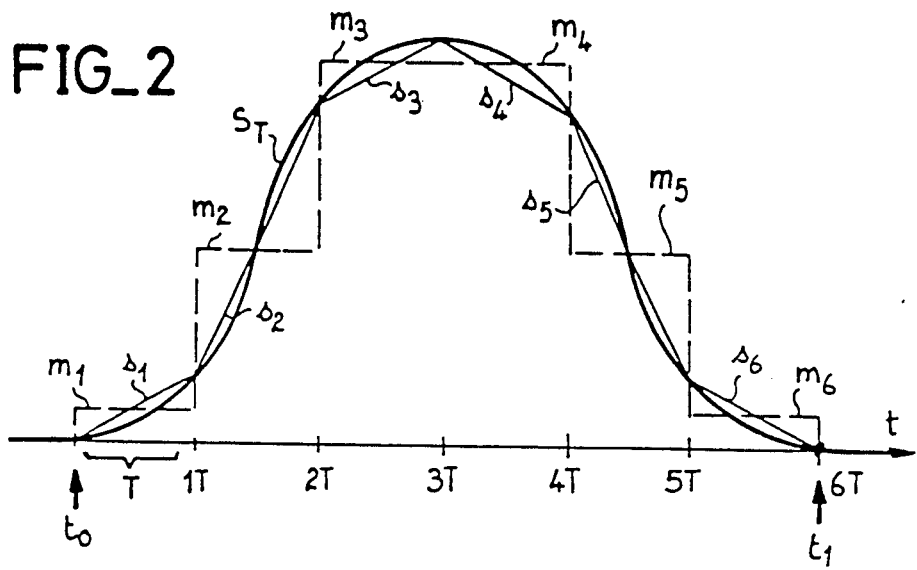
FIG_2
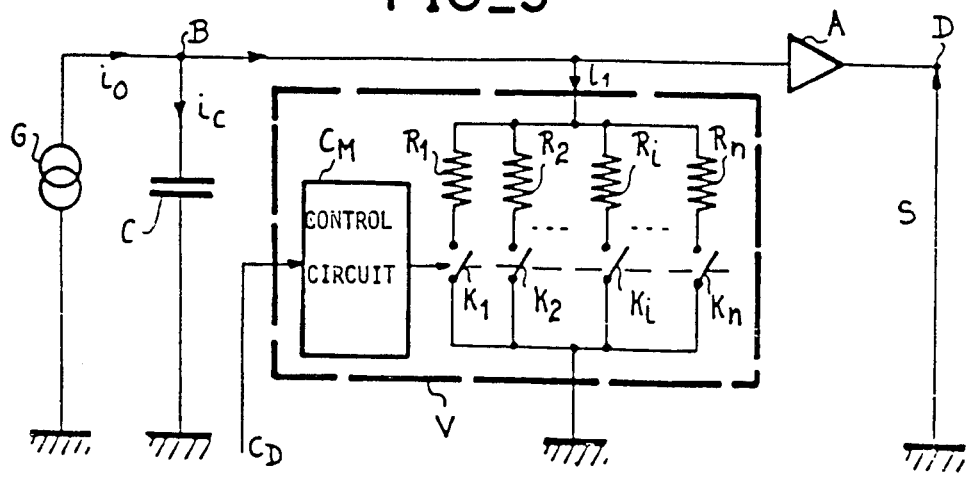
FIG_3

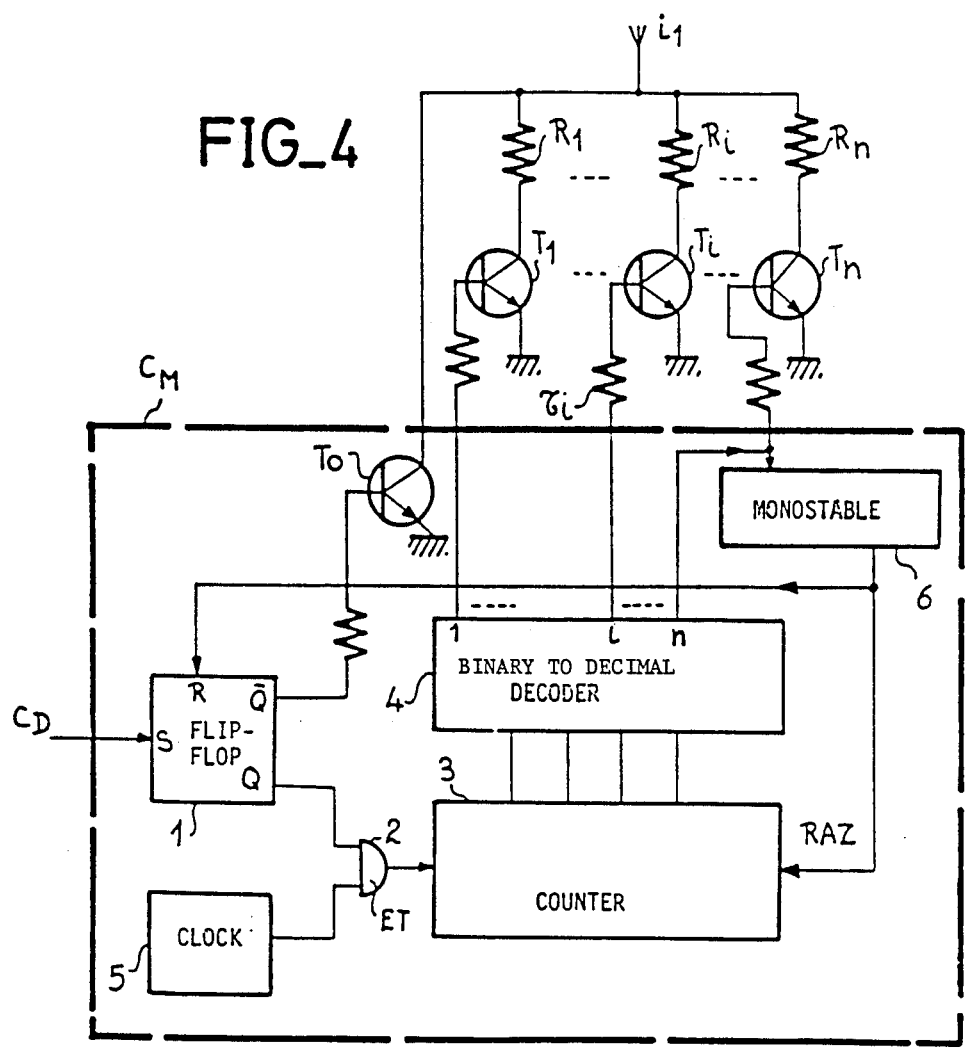
FIG_4
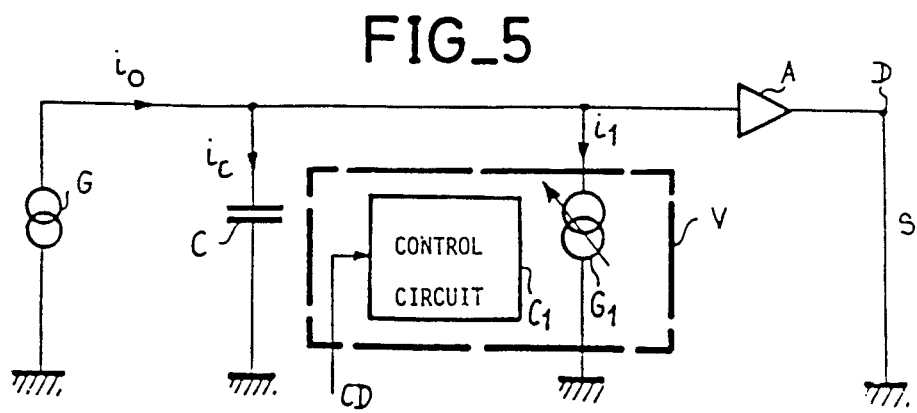
FIG_5

FIG_6
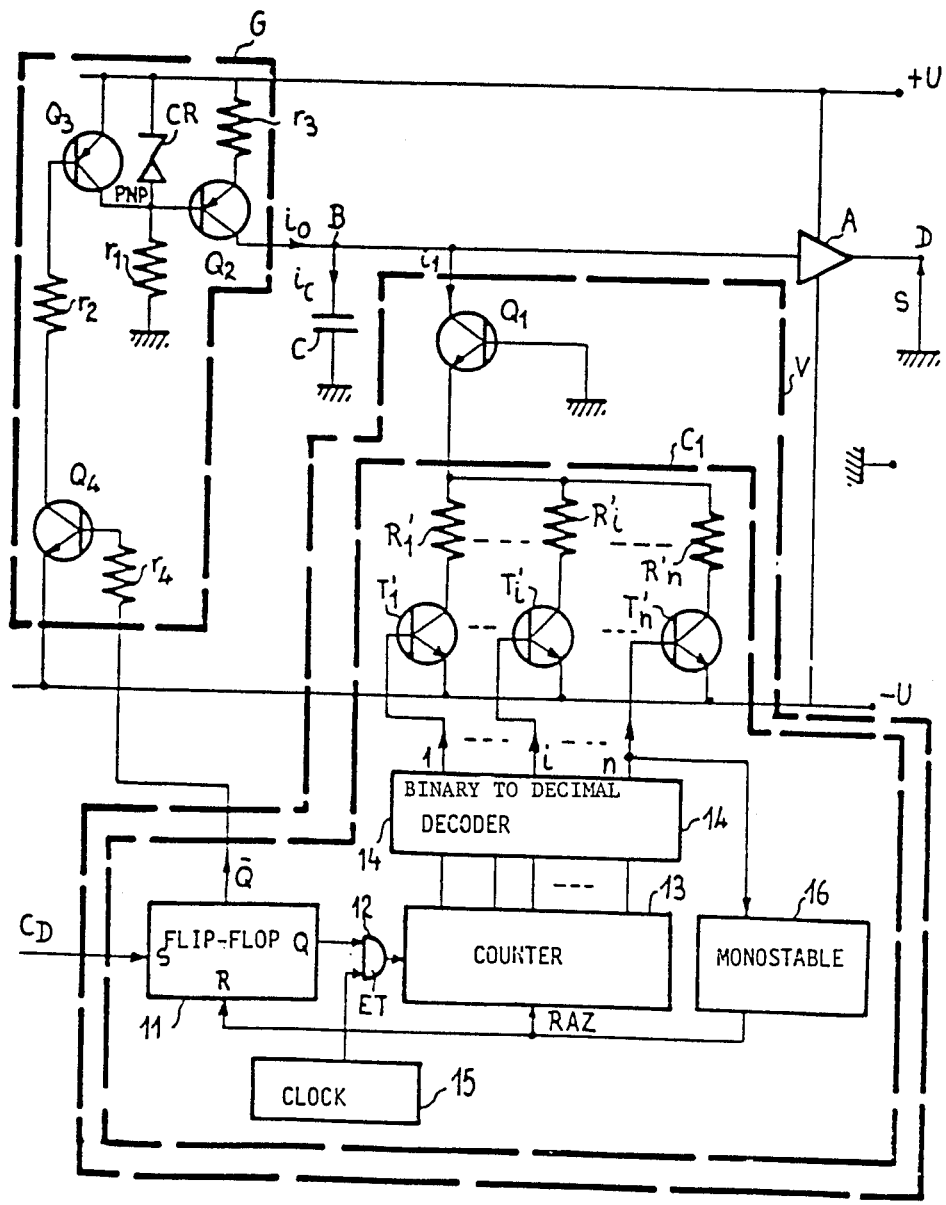

DEVICE FOR GENERATING A SIGNAL HAVING A COMPLEX FORM BY LINEAR APPROXIMATIONS

BACKGROUND OF THE INVENTION

1. Field of the Invention

The present invention concerns a device for generating a signal having a complex form, more particularly a device adapted to produce rapidly rising wave front impulse type signals. In this device, the signal is formed by approximations of linear segments having variable slopes.

2. Description of the Prior Art

In the field of known techniques for producing short rise time pulses and especially in distance-measurement-equipment type (DME) systems for radionavigation aid of aircraft, it is frequently necessary to create pulse type signals having a well-defined form. In the case of DME systems, for example, two specific forms are necessary:

- for N-DME or navigation DME, the form of the pulse must be as close as possible to a gaussian shape or a square cosine shape on each of the leading-edge and trailing-edge of the pulse;
- for the P-DME (or Precision-DME) the leading-edge of the pulse must be substantially sinusoidal whereas the trailing-edge must follow a square cosine law.

Different circuits for these systems are known in the prior art.

Among these circuits are the analog circuits based on the controlled discharge of an oscillating circuit utilizing LC elements. The drawback of this solution is the lack of precision between the start time of the modulation and the resulting form thereof. In the framework of DME, this becomes apparent by a lack of precision with respect to the distance measurement taken which, it will be recalled, utilizes as reference time the leading-edge of the pulse.

Circuits utilizing digital techniques are also known, such as those which utilize a digital-analog converter supplying a variable output voltage, according to a determined law, in relation with a defined clock period. The pulse thus obtained is in the form of a series of stair steps and gives a contour close to that desired. Smoothing is thus necessary to obtain the final form of the pulse. The main drawback of this solution is due to the technological limitation which appears when the leading-edge of the pulse becomes short.

In this case, for a good approximation of the curve, it is necessary to utilize a large number of steps, i.e. a very rapid clock and high-speed digital-analog converters. By way of example, for steps of 20 ns, the clock must work at 50 MHz, with a converter adapted to follow this frequency.

SUMMARY OF THE INVENTION

An object of the present invention is a device for generating a signal having a complex form which does not present the above mentioned limitations. It mainly consists in an analog converter supplying signals linearly variable with time, the slope of these signals with time being discretely variable. A complex signal is thus formed by approximation, by generating a series of successive segments forming a composite signal. The slope of the segments varys by discrete values so as to more closely follow a desired form.

More specifically, the device according to the invention comprises means for generating a constant current supplying two branches of a circuit. The first branch comprising a capacitor. The second branch comprises means for varying the current circulating therein, and as a result the current circulating in the first branch. The signal available at the terminals of the capacitor varies substantially linearly with time and with a slope function of the current circulating in the first branch. A signal having a predetermined form is thus obtained at the terminals of the capacitor, by approximation, by discretely varying the value of the current circulating in the second branch.

BRIEF DESCRIPTION OF THE DRAWINGS

Other objects, features and advantages of the invention will become apparent after reading the following description, given by way of non-limitative example and illustrated by the appended drawings, which represent:

FIG. 1 the general diagram of the device according to the invention;

FIG. 2 an example of the signal having a complex form obtained by using the device according to the invention;

FIG. 3 a first embodiment of the device according to the invention;

FIG. 4 a practical realization example of the preceding figure;

FIG. 5 a second embodiment of the device according to the invention;

FIG. 6 a practical realization example of the preceding figure.

In these different figures, the same references refer to identical elements.

DETAILED DESCRIPTION OF THE DRAWINGS

FIG. 1 represents the general diagram of the device according to the invention.

The device comprises means G for generating a constant current, schematized by a current power source, connected between a point B and the earth, supplying a constant current $i_o$. This current supplies two branches of a circuit, a first branch comprising between point B and the earth, a capacitor C in which circulates a current ic, and a second branch also between point B and the earth carrying a current $i_1$. As is known, $i_o = i_c + i_1$. The second branch comprises means V controlling the variation of the current $i_1$ and consequently the variation of the current $i_c$ circulating in the first branch. The variation means V receive an external command $C_D$. The output signal S of the device is taken at the terminals of the capacitor C.

During operation, the current generator G supplies the constant current $i_o$ which charges the capacitor C. The voltage at the terminals of the capacitor rises (or decreases) basically linearly with a slope p so that:

$$p = dv/dt = i_c/C$$

where v is the voltage at the terminals of the capacitor and t is time. Therefore, the signal S is a voltage linearly with time with a slope p. When the current $i_c$ is caused to vary, in response to variations in the current $i_1$ of the second branch, the slope p varies. In this way, a signal formed of a sequence of segments is obtained for S, each segment varying linearly with time but with a distinct slope. The choice of different slopes allows the formation, through approximation, of a complex signal having a defined form.

The operation of this circuit is illustrated hereinbelow with reference to FIG. 2, which represents an example of a possible complex signal which can be obtained with the circuit represented in FIG. 1.

FIG. 2 thus represents the form, referenced $S_T$, of the signal sought. It is, for example, a gaussian form of pulse type signal. The approximation of this signal, which is available from a digital circuit according to the prior art such as mentioned hereinabove, has also been represented. By designating with $t_o$ and $t_1$ the instants of the beginning and the end of the pulse, the corresponding duration $t_1-t_o$ is divided into a whole number of periods, six periods of duration T in the example of this figure. With a device according to the prior art, stair steps referenced $m_1$ to $m_6$ are thus generated. With only six steps, the device of the prior art only allows the obtaining of a very rough approximation of the desired form. The number of steps, for short duration pulses (several microseconds) is limited by the maximum frequency that can be utilized by the circuits that carry out the sampling.

FIG. 2 also represents, for the same division into six steps T, the sequence of segments, referenced $s_1$ to $s_6$, obtained by using the device shown in FIG. 1. During the first period T, the current $i_1$ is fixed so that charging of the capacitor C is carried out with a given slope corresponding substantially to the line over the signal $S_T$ in the period involved. At the end of the first period T, under control of the circuit V, the current $i_1$ varies and subsequently the slope of the charge of the capacitor also varies so as to substantially follow the signal $S_T$ in this time interval. At the end of the second period T, the current $i_1$ is again modified so that, correlatively, the slope of the charge of the capacitor C is brought to a value such that the segment $s_3$ is a line under the signal $S_T$ in this interval. The end of the third period representing, in the given example, an axis of symmetry of the signal $S_T$, the same variations intervene but this time on the discharge slope of the capacitor C in order to form segments $s_4$, $s_5$ and $s_6$.

It appears from FIG. 2 that a sequence of segments, the slope of which varies discretely at predetermined instants, results in a better approximation of a given form $S_T$ than a series of stair steps. This is even more evident when the rising or decreasing slope of the signal is great, for a given number of steps (of duration T). It should be noted that oftentimes the number of steps cannot be increased (or the duration of T cannot be reduced) due to technological limitation.

It is to be noted that the duration of each of the segments $s_1$ to $s_6$ is not necessarily the same, as is the case in the example shown in FIG. 2.

Furthermore, the operation of the circuit V for varying the current $i_1$ is actuated at the instant $t_o$ by external command $C_D$. The times at which there is a change in the value, in successive times, of the current $i_1$ after the instant $t_o$ can be achieved either by the circuit V itself, or by being programmed or controlled from outside. This is equally true for the values of the current $i_1$ that can be selected either by external command, or known and automatically generated by circuit V.

FIG. 3 represents a first embodiment of the general diagram of FIG. 1.

Accordingly, the following elements are shown on FIG. 3: the generator G of the constant current $i_o$, the capacitor C through which flows the current $i_c$, and the means V for varying the current $i_1$. Also connected to point B is a wide band separator operational amplifier A, the function of which is to decouple the circuit of FIG. 3 from the part (not shown) situated downstream from this circuit. The signal S is thus available between referenced output D of this amplifier A and earth.

The means V for varying the current $i_1$ comprise in the present example a resistance switching device. More specifically, between point B and the earth C channels are connected in parallel. Each of these channels comprises in series a resistance $R_i$ (i varying from 1 to n) and a switch $k_i$ (i varying in the same way). The switches $k_i$ of the different channels are closed successively upon control from a circuit $C_M$, which receives the external command signal $C_D$.

During operation when switch $k_i$ is ON, the resistance $R_i$ of the $i^{th}$ channel is thus put in parallel with the capacitor C. It consequently removes a portion ($i_1$) of the current that would otherwise have been available to charge the capacitor C and therefore changes the slope of the signal (S) available at its terminals. The values of the resistances $R_1 \ldots R_n$ are chosen in function of the different (n) slopes desired for signal S. The number n of channels defines, in this case, the number of segments forming the signal S.

FIG. 4 represents in further detail an embodiment of the switches $k_i$ and their control circuit $C_M$.

FIG. 4 also represents the current $i_1$ shared between the n preceding channels and a supply transistor $T_o$ of the control circuit $C_M$. The switches $k_i$ are formed in the present embodiment by transistors $T_i$ (i always varying from 1 to n) that are, for example, of the NPN type, their collector being connected to the resistance $R_i$, their emitter to the earth and their base to a binary to decimal decoder 4 of the control circuit $C_M$, through a resistance $r_i$. The control circuit $C_M$ also includes a counter 3, a monostable multivibrator 6, an RS type flip-flop 1, a clock 5 and an AND gate 2, connected as shown.

The operation of the device represented in FIG. 4 is as follows.

At the instant $t_o$ of the beginning of the pulse, the command $C_D$ is at the value zero and the output Q of the flip-flop 1 is reset to zero, thus its output $\overline{Q}$ is equal to 1. The output Q of the flip-flop 1 is connected to an input of the AND gate 2, the other input of this AND gate is connected to the clock 5; and the output of the AND gate is connected to the counter 3. At this instant, pulses of clock 5 cannot reach the counter 3. Furthermore, since the output $\overline{Q}$ of flip-flop 1 is set to 1 and is connected to the base of the transistor $T_o$, the latter is caused to conduct; and the current $i_1$ flows to earth, from the collector to the emitter of the transistor $T_o$. It thus appears that the capacitor C (FIG. 3) is short-circuited and the signal S is thus zero.

After the instant $t_o$, the command $C_D$ (a logic pulse of level 1) received on the input S of the flip-flop 1 results in the change of the output Q to 1, the output $\overline{Q}$ thus being at zero. This turns off transistor $T_0$. Also, the output Q being at 1, the AND gate 2 passes the pulses of the clock 5 (period T) to the counter 3. At this time, the counter 3 thus counts the clock pulses. The counter 3 is connected on a plurality of bits in parallel to the decoder 4. If for example the number of channels is equal to 10, the output of the counter 3 will be expressed on 4 bits ($2^4$ is higher than 10). The outputs of the binary to decimal decoder 4 are n in number and each is respectively connected to the n bases of the transistors $T_i$ through the resistances $r_i$. The decoder 4 thus successively controls the transistors $T_1$ to $T_n$ and successively connects the resistances $R_1$ to $R_n$ in parallel to the capacitor C (FIG. 3). As described hereinabove, the value of the resistances $R_i$ controls the charging current of the capacitor C, thus the slope of the signals obtained successively at the output of the amplifier A.

After the counter 3 has counted n clock signals, at the instant $t_1$ (FIG. 2), the output signal of the decoder 4 is directed towards the $n^{th}$ and last channel. The output signal is also fed to and thereby setting the monostable 6. The output of the monostable is connected to both the input R (reset) of the flip-flop 1 and to the reset to zero input (RAZ) of the counter 3. When the monostable is set, it changes the state of the flip-flop 1 and resets the counter 3 to zero. The change of state of the flip-flop 1 closes the AND gate 2, thus interrupts the counting of the counter 3, and causes the transistor $T_o$ to conduct, which discharges the capacitor C by short-circuiting it to bring back the output signal (S) to zero.

The system is thus ready for creating a fresh pulse if a control pulse ($C_D$) is present at the input S of the flip-flop 1.

FIG. 5 represents a second embodiment of the device according to the invention.

In this embodiment, the following elements are included: the constant current generator G, the capacitor C and the means V for varying the current $i_1$ are connected in parallel, the output signal being available at the output of the amplifier A with an input connected as shown.

The means V for varying the current $i_1$ in the present example include a further current generator $G_1$, this current being variable upon the command of a control circuit $C_1$ that receives the external command signal $C_D$. The command of the current generator $G_1$ thus varies the current $i_1$ which, in turn varies the current $i_c$ through crossing the capacitor C.

The advantage of the embodiment represented in FIG. 5 with respect to the previously represented embodiment (FIG. 3) is that it allows the obtaining of segments ($s_1 \ldots s_6$, FIG. 2) that are perfectly linear, due to the fact that the generator $G_1$ is a constant current generator for a given segment. However, this perfect linearity is obtained by increasing the complexity of the device.

FIG. 6 represents a practical embodiment of the diagram of FIG. 5.

This figure shows a detailed description of the generator G, the capacitor C, the amplifier A and the means V.

The generator G, connected to a positive power supply referenced +U, comprises a PNP type transistor $Q_3$ of which the emitter is connected to the power supply +U, the collector to the ground through a resistance $r_1$ and the base, through a resistance $r_2$, to the collector of a transistor $Q_4$ of the NPN type. The emitter of the transistor $Q_4$ is connected to a negative power supply, referenced −U. The collector of the transistor $Q_3$ is furthermore connected, on the one hand, to a Zener diode $C_R$ the other terminal of which is connected to the +U power supply, and on the other hand, to the base of a PNP type transistor. The emitter of this transistor $Q_2$ is also connected to the +U power supply through a resistance $r_3$ and the collector of this same transistor $Q_2$ is connected to the point B.

The variation means V comprise a transistor $Q_1$, for example of the NPN type, the collector of which is connected to the point B, the base to the earth and the emitter to the control means $C_1$ of the current $i_1$ that flows through the transistor $Q_1$.

The control circuit $C_1$ mainly consists of a series of n channels in parallel. Each of these channels comprises a resistance $R'_1$ and a controllable switch, constituted by a transistor $T'_i$ and controlled in an equivalent manner to that described with reference to FIG. 4. More specifically, each of the NPN type transistors $T'_i$ is thus connected by its collector to the resistance $R'_i$ and by its emitter to the −U power supply, its base being connected to an output i of a binary to decimal decoder 14. The control circuit $C_1$ further comprises a flip-flop 11, a clock 15, an AND gate 12, a counter 13 and a monostable multivibrator 16.

The operation of this assembly is as follows. Prior to the instant $t_o$ (FIG. 2) the command $C_D$ is set at zero. The output Q of the flip-flop 11 is at zero, thus closing the AND gate 12 interposed between the counter 13 and the clock 15. The output $\overline{Q}$ of the flip-flop 11 is thus at 1. This output $\overline{Q}$ is connected through the intermediary of a resistance $r_4$ to the base of the transistor $Q_4$, which is thus conductive. Thereafter, the transistor $Q_3$ also conducts, thereby short-circuiting the diode $C_R$. The transistor $Q_2$ is thus blocked and the current $i_o$ is zero. The output signal is therefore equally zero.

After instant $t_o$, the control signal $C_D$ sets the flip-flop 11, its output Q changing to 1 and its output $\overline{Q}$ to zero. The output $\overline{Q}$ being at zero, the transistor $Q_4$ is blocked, thereby causing the blocking of the transistor $Q_3$, thus allowing the transistor $Q_2$ to conduct and to thus establish the current $i_o$. The switching of output Q of the flip-flop 11 forms 0 to 1 allows the clock pulses of clock 15 to pass from AND gate 12 to the counter 13. The counter 13 thus counts the pulses of the clock 15 (of period T). The decoder 14 is connected to the counter 13 and to the transistors $T'_i$ as shown in FIG. 4 for the decoder 4 to the counter 3 and to the transistor $T_i$. The operation is thus analogous to that of FIG. 4 and the decoder 14 successively controls the transistors $T'_1$ to $T'_N$. When one of these transistors $T'_i$ conducts, the current $i_1$ is established in the transistor $Q_1$ and the value of this current is a direct function of the value of the corresponding resistance $R'_i$. The capacitor is thus charged with the difference of current $i_o - i_1$. The voltage at the terminals of the capacitor C is input to the amplifier A so as to give the signal S.

At the instant $t_1$, when the counter 13 has counted n clock pulses, the monostable 16 connected to the output n of the decoder 14 receives a pulse from this output and thus delivers a signal both at the reset at zero input of the counter 13 and at the input R (reset) of the flip-flop 11. This has the effect of changing the state of the flip-flop 11, the output Q being reset at zero and the output $\overline{Q}$ to 1. The circuit is again in the state prior to the instant $t_o$. It is thus ready to form a new pulse.

I claim:
1. A device for generating a signal with a complex waveform and short risetime including:
   a constant current generator,
   a pair of circuits connected in parrallel to said constant current generator,
   a first circuit of said pair including a capacitor with two terminals,
   a second circuit of said pair including means for varying a current circulating in said second circuit so that a corresponding current variation is reflected in said first circuit, and wherein an output terminal connected to one terminal of said capacitor produces said complex waveform with a short risetime.

2. Apparatus according to claim 1, wherein the means for varying a current comprises:
a plurality of channels, each of the channels having a resistance connected in series with a switching means;
circuit means for controlling the switching means so as to successively connect each of the resistances in parallel with the capacitor, the value of each resistance being determined as a function of a desired slope for the output signal at the instant of time that a given resistance is connected to the capacitor.

3. Apparatus according to claim 1, wherein the means for varying a current comprises:
a second generator for supplying a second constant current, the second constant current being controlled by a control means to produce a second constant current of successively different values, each of the successively different values being determined as a function of the desired slope for the output signal at a corresponding instant of time.

4. Apparatus according to claim 3, wherein the control means comprises:
a plurality of channels, each of the channels having a resistance connected in series with a switching means, the switching means being controlled by a logic circuit so as to successively connect each of the channels to the second generator.

5. Apparatus according to claim 2 or 4, wherein the switching means comprises a transistor.

* * * * *